(12) United States Patent
Chang et al.

(10) Patent No.: US 11,772,228 B2
(45) Date of Patent: Oct. 3, 2023

(54) CHEMICAL MECHANICAL POLISHING APPARATUS INCLUDING A MULTI-ZONE PLATEN

(71) Applicant: Taiwan Semiconductor Manufacturing Company, Ltd., Hsinchu (TW)

(72) Inventors: Ting-Hsun Chang, Kaohsiung (TW); Hung Yen, Kaohsiung (TW); Chi-Hsiang Shen, Tainan (TW); Fu-Ming Huang, Shengang Township (TW); Chun-Chieh Lin, Hsinchu (TW); Tsung Hsien Chang, Shalu Township (TW); Ji Cui, Bolinbrook, IL (US); Liang-Guang Chen, Hsinchu (TW); Chih Hung Chen, Hsinchu (TW); Kei-Wei Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 751 days.

(21) Appl. No.: 16/746,292

(22) Filed: Jan. 17, 2020

(65) Prior Publication Data

US 2021/0220964 A1 Jul. 22, 2021

(51) Int. Cl.
*B24B 37/16* (2012.01)
*B24B 57/02* (2006.01)
*B24B 37/015* (2012.01)
*H01L 21/306* (2006.01)

(52) U.S. Cl.
CPC ............ *B24B 37/16* (2013.01); *B24B 37/015* (2013.01); *B24B 57/02* (2013.01); *H01L 21/30625* (2013.01)

(58) Field of Classification Search
CPC ....... B24B 37/16; B24B 37/015; B24B 57/02; H01L 21/30625
USPC ................................ 451/28, 41, 57, 287, 288
See application file for complete search history.

(56) References Cited

U.S. PATENT DOCUMENTS

| | | | | |
|---|---|---|---|---|
| 6,015,337 A * | 1/2000 | Hiyama | ................... | B24B 37/12 451/287 |
| 6,248,006 B1 * | 6/2001 | Mukhopadhyay | ...... | B24B 37/20 451/285 |
| 6,663,472 B2 * | 12/2003 | Lim | ........................ | B24B 37/26 451/41 |
| 7,121,933 B2 * | 10/2006 | Kim | ........................ | B24D 7/14 451/504 |
| 2004/0224615 A1 * | 11/2004 | Chen | ........................ | B24B 37/16 451/41 |
| 2005/0272348 A1 * | 12/2005 | Min | ........................ | B24B 37/20 451/11 |

(Continued)

*Primary Examiner* — Joel D Crandall
*Assistant Examiner* — Shantese L McDonald
(74) *Attorney, Agent, or Firm* — Slater Matsil, LLP (57) ABSTRACT

A chemical mechanical planarization apparatus includes a multi-zone platen comprising a plurality of individually controlled concentric toroids. The rotation direction, rotation speed, applied force, relative height, and temperature of each concentric toroid is individually controlled. Concentric polishing pads are affixed to an upper surface of each of the individually controlled concentric toroids. The chemical mechanical planarization apparatus includes a single central slurry source or includes individual slurry sources for each individually controlled concentric toroid.

20 Claims, 8 Drawing Sheets

(56) References Cited

U.S. PATENT DOCUMENTS

2019/0143476 A1* 5/2019 Wu ................. B24B 37/015
 451/7

* cited by examiner

CHEMICAL MECHANICAL POLISHING APPARATUS INCLUDING A MULTI-ZONE PLATEN

BACKGROUND

Generally, semiconductor devices comprise active components (e.g., transistors, diodes, or the like) formed on a substrate. Any number of interconnect layers may be formed over the substrate connecting active components to each other and to other devices. The interconnect layers may be fabricated from low-k dielectric material layers with metallic trenches or vias disposed therein. As the layers of a device are formed, the device is sometimes planarized or polished.

However, the semiconductor industry continues to improve the integration density of various electronic components (e.g., transistors, diodes, resistors, capacitors, etc.) by continual reductions in minimum feature size, which allow more components to be integrated into a given area. As the minimum feature sizes are reduced, additional problems arise that should be addressed.

BRIEF DESCRIPTION OF THE DRAWINGS

Aspects of the present disclosure may be understood from the following detailed description when read in conjunction with the accompanying Figures. It is noted that, in accordance with standard practice in the industry, various features may not be illustrated to scale. In fact, dimensions of various features may be arbitrarily increased or reduced for clarity of discussion or illustration.

DETAILED DESCRIPTION

The following disclosure provides different embodiments, or examples, for implementing different features. Specific examples of components and arrangements are described below to simplify the present disclosure. These are, of course, merely examples and are not intended to be limiting. For example, the formation of a first feature "over" or "on" a second feature, in the description that follows, may include embodiments in which first and second features are formed in direct contact, and may also include embodiments in which additional features may be formed between first and second features, such that the first and second features may not be in direct contact. Additionally, the present disclosure may repeat reference numerals or letters in various examples. Such repetition is for brevity and clarity, and does not of itself dictate a relationship between various embodiments or configurations discussed.

Furthermore, spatially relative terms, such as "beneath," "below," "lower," "above," "upper," or the like, may be used herein for ease of description; e.g., to reference a relationship between one element or feature and another element or feature. Spatially relative terms are intended to encompass different orientations of a device in use or operation, in addition to orientations illustrated in the Figures. An apparatus may be otherwise oriented (e.g., rotated by 90 degrees or at other orientations) and the spatially relative descriptors used herein may likewise be interpreted accordingly.

Chemical mechanical polishing (or planarization) (CMP) is one method of planarizing features produced in the manufacture of semiconductor devices. The process uses an abrasive material and a reactive chemical slurry in conjunction with a polishing pad. The polishing pad typically has a greater diameter than that of the semiconductor wafer. The pad and wafer are pressed together by operation of a dynamic polishing head. The dynamic polishing head may be rotated around different axes of rotation (e.g., not concentric). The process removes material and tends to even out irregular topography, making the wafer flat or substantially planar. This prepares the wafer for the formation of additional overlying circuit elements. In accordance with representative aspects, chemical mechanical planarization can bring an entire wafer surface within a given depth of field of a photolithography system. Typical depth-of-field specifications are on the order of Angstroms. In other implementations, chemical mechanical planarization may also be employed to selectively remove material based on its location on the wafer.

In general application, a wafer is placed in a carrier head, where the wafer is held in place by a retaining ring. The carrier head and the wafer are then rotated as downward pressure is applied to the wafer to press against a polishing pad. A reactive chemical solution is dispensed on a contacting surface of the polishing pad to aid planarization. The surface of a wafer may thus be planarized using a combination of both mechanical and chemical mechanisms.

Various representative embodiments are described with respect to a specific context, namely a chemical mechanical polishing (CMP) apparatus and system. Various representative embodiments provide a multi-zone chemical mechanical planarization apparatus and system, components related to a multi-zone platen of the multi-zone chemical mechanical planarization apparatus, and methods for planarizing or polishing a workpiece (e.g., a semiconductor wafer, or the like) to exhibit a more uniform or otherwise improved thickness profile without undue polishing pad wear. In particular, embodiments relating to a multi-zone platen are described, which can better control the polishing conditions and control the wafer properties by individually controlling zones of the CMP process.

Figure 1:
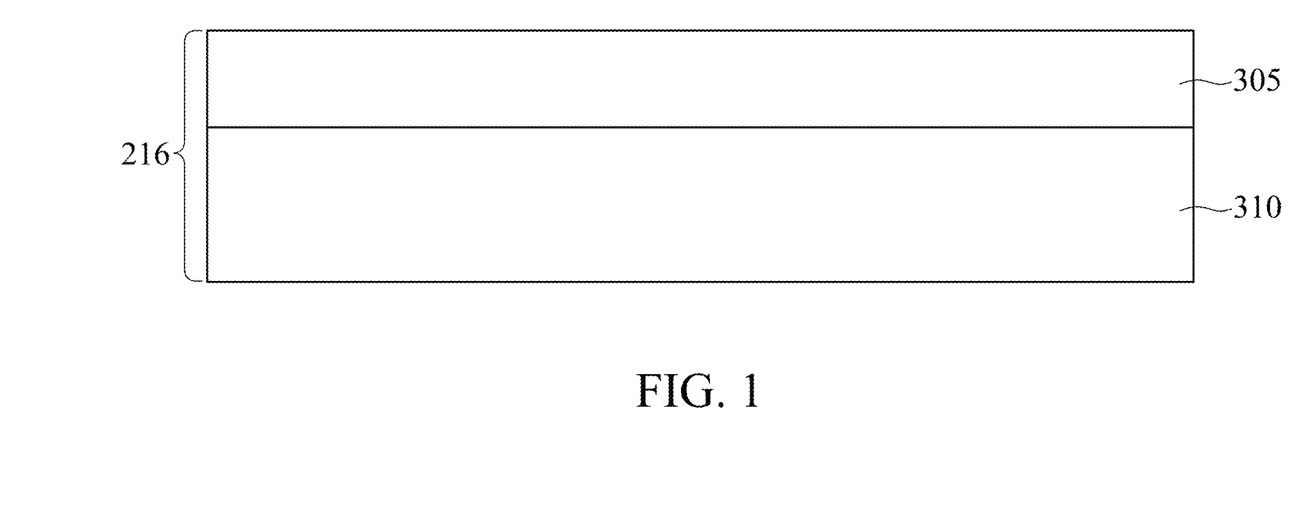
FIG. 1 representatively illustrates a semiconductor wafer and a layer to be polished, in accordance with some embodiments.

FIG. 1 representatively illustrates a semiconductor wafer 216 that will be polished with a chemical mechanical polishing apparatus. In some embodiments, the wafer 216 comprises, for example, a semiconductor substrate 310 (e.g., comprising silicon, a III-V semiconductor material, or the like), active devices (e.g., transistors, or the like) on the semiconductor substrate 310, and various interconnect structures. Representative interconnect structures may include conductive features, which electrically connect active devices in order to form functional circuits. In various representative embodiments, chemical mechanical planarization processing may be applied to wafer 216 during any stage of manufacture in order to planarize features or otherwise remove undesired material (e.g., dielectric material, semiconductor material, conductive material, or the like) of wafer 216.

For example, the wafer 216 may comprise a layer to be planarized 305. In an embodiment the layer to be planarized 305 is a layer that has been deposited and is now desired to planarized in preparation for further manufacturing. In some embodiments in which the layer to be planarized 305 comprises tungsten, the layer to be planarized 305 may be polished to form, e.g., contact plugs contacting various active devices of wafer 216. In embodiments in which the layer to be planarized 305 comprises copper, the layer to be planarized 305 may be polished to form, e.g., various interconnect structures of wafer 216. In embodiments in which the layer to be planarized 305 comprises a dielectric material, the layer to be planarized 305 may be polished to form, e.g., shallow trench isolation (STI) structures on wafer 216. The layer to be planarized 305 may be any suitable layer and any suitable material during the manufacturing of the wafer 216.

In some embodiments, the layer to be planarized 305 may have a non-uniform thickness (e.g., exhibiting local or global topological variation of an exposed surface of the layer to be planarized 305) resulting from underlying structures and process variations experienced during deposition of the layer to be planarized 305. For example, in an embodiment in which the layer to be planarized 305 comprises tungsten, the layer to be planarized 305 may be formed by depositing tungsten into an opening through a dielectric layer using a chemical vapor deposition (CVD) process. Due to CVD process variations or other underlying structures, the layer to be planarized 305 may have a non-uniform thickness that ranges from about 5 nm to about 20 nm, with a mean value of about 10 nm, and a standard deviation of about 3 nm.

Figure 2:
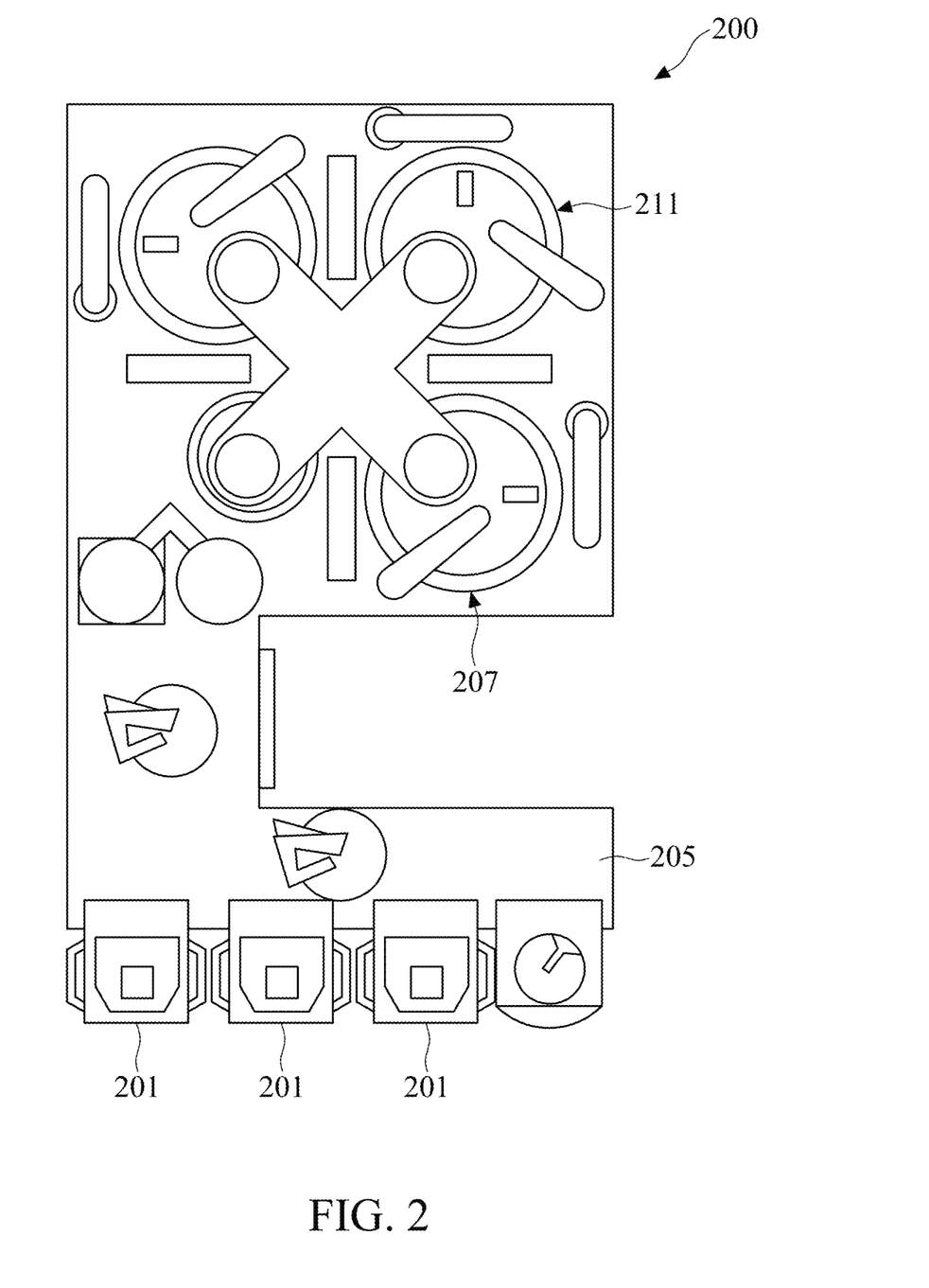
FIG. 2 illustrates a chemical mechanical polishing (CMP) system in accordance with an embodiment.

FIG. 2 illustrates a CMP system 200 which may be used to remove material from the layer to be planarized 305 of wafer 216. The CMP system 200 may include loadlocks 201, cleaning station 205, a high-rate platen 207, and a buffing platen 211. In an embodiment at least one or both of high-rate platen 207 and buffing platen 211 can comprise a multi-zone platen 202 (not explicitly illustrated in FIG. 2 but illustrated and discussed further below with respect to FIG. 4). The loadlocks 201 may be used for loading the wafer 216 into the CMP system 200, and then unloading the wafer 216 once the CMP process has been completed. The high-rate platen 207 may be used for polishing and removing wafer material with a relatively high polishing rate, such as a bulk polishing rate, while the buffing platen 211 may be used for polishing at a relatively low polishing rate to and also to fix defects and scratches that may occur during the process. If the multi-zone platen 202 is used, multiple polishing rates for different zones of the wafer 216 can be simultaneously achieved as is explained in further detail below.

Figure 3:
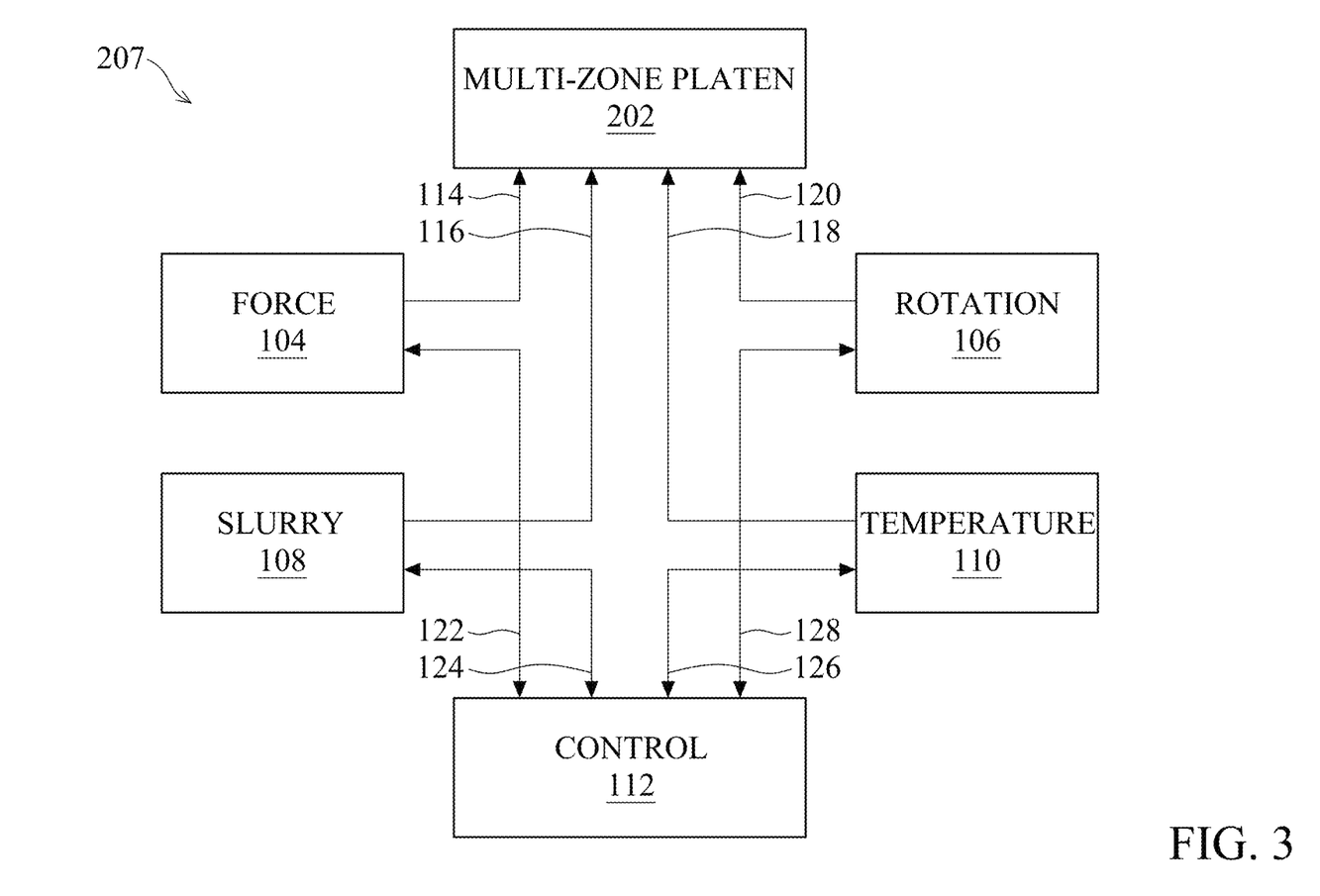
FIG. 3 representatively illustrates a block diagram of a chemical mechanical planarization system, in accordance with some embodiments.

FIG. 3 representatively illustrates a block diagram of the high-rate platen 207, in accordance with some embodiments. The high-rate platen 207 includes the multi-zone platen 202, and a plurality of support components coupled to and in communication with the multi-zone platen 202. In some embodiments the multi-zone platen 202 can include a plurality of individually controlled rotating concentric toroidal platen sections (e.g., a first toroidal platen section 204, a second toroidal platen section 206, and a third toroidal platen section 208, not illustrated in FIG. 3 but illustrated below with respect to FIG. 4).

Additionally, the high-rate platen 207 can include a force component 104 (illustrated in more detail below with respect to FIG. 5) for applying force or pressure to at least some of the toroidal platen sections using mechanical linkage 114, and the force component 104 can also control the relative height of at least some of the toroidal platen sections. In an embodiment, force component 104 can include a controlled pneumatic or hydraulic cylinder.

In some embodiments the high-rate platen 207 can include a rotation component 106 (illustrated in more detail below with respect to FIG. 5) for applying rotation to and controlling the rotation speed and direction of at least some of the toroidal platen sections using mechanical linkage 120 such as gearing mechanisms. In an embodiment, rotation component 106 can include a motor, such as a stepper motor.

In some embodiments high-rate platen 207 can include a slurry component 108 (illustrated in more detail below with respect to FIG. 4) for providing a slurry source to at least some of the toroidal platen sections using mechanical linkage 116 such as pipes or tubes. In an embodiment, slurry component 108 can include a common slurry supply.

In some embodiments high-rate platen 207 can include a temperature component 110 (illustrated in more detail below with respect to FIG. 6) for controlling the temperature of at least some of the toroidal platen sections using mechanical linkage 118 such as pipes or tubes. In an embodiment, temperature component 110 can include a common deionized water supply and a table chiller for individually controlling the temperature of the pipes or tubes coupled to the deionized water supply.

In some embodiments, at least some of the force component 104, the rotation component 106, the slurry component 108, and the temperature component 110 are controlled by a control component 112, which can be, for example, a control center including a microprocessor. The force component 104 is coupled to control component 112 through bus 122, the rotation component 106 is coupled to control component 112 through bus 128, the slurry component 108 is coupled to control component 112 through bus 124, and the temperature component 110 is coupled to control component 112 through bus 126. In some embodiments, at least some of the force component 104, the rotation component 106, the slurry component 108, and the temperature component 110 can include sensors and respectively communicate with control component 112 through bi-direction busses 122, 128, 124, and 126.

In an embodiment, the control component 112 may comprise a microprocessor for providing digital control signals to actuators for controlling stepper motors, hydraulic or pneumatic cylinders, or other mechanical systems coupled to the platen sections or the polisher head. In another embodiment, the control component 112 may also provide analog control signals. For example, the control component 112 may be programmed to provide a single set of control signals for a single chemical mechanical polishing process. Additionally, the control component 112 may be programmed to continually adjust the control signals to adjust the polishing conditions during a single chemical mechanical polishing process. In an embodiment, the control component 112 can be programmed to provide multiple different sets of control signals for multiple sequential chemical mechanical polishing processes.

Figure 4:
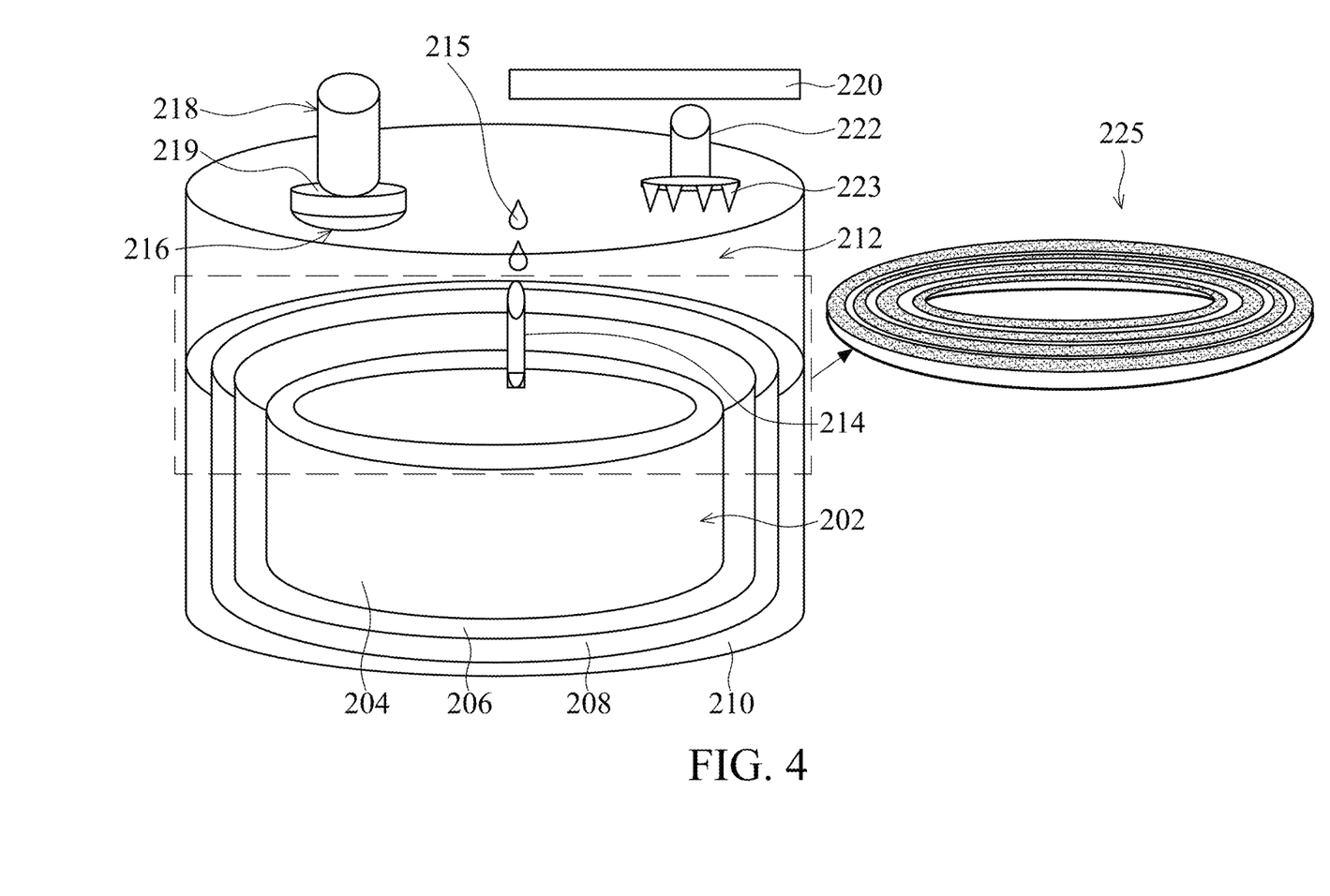
FIG. 4 representatively illustrates a three-quarter isometric view of a multi-zone platen, in accordance with some embodiments.

FIG. 4 illustrates a three-quarter isometric view of the multi-zone platen 202 in accordance with representative embodiments corresponding to the component blocks shown in the block diagram of FIG. 3. In an embodiment, the multi-zone platen 202 comprises the plurality of concentric toroidal platen sections, such as the first toroidal platen section 204, the second toroidal platen section 206, and the third toroidal platen section 208 nested in a platen carrier 210. While three concentric toroidal platen sections (e.g., the first toroidal platen section 204, the second toroidal platen section 206, and the third toroidal platen section 208) are shown, any number can be used as is described in further detail below. A segmented polishing pad 225 affixed to the top surface of the concentric toroidal platen sections is placed over the first toroidal platen section 204, the second toroidal platen section 206, and the third toroidal platen section 208 in surface zone 212. Each segment of the polishing pad 225 also comprises a toroidal polishing pad section 224 (best seen in FIG. 5) corresponding to each toroidal platen section and is described in further detail below.

FIG. 4 additionally illustrates a polisher head 218 which is placed over the polishing pad 225 located in surface zone 212. In some embodiments the polisher head 218 includes a carrier 219 to be used to carry and hold the wafer 216, and which may further comprise a membrane configured to interface with the wafer 216 during a chemical mechanical planarization process. The carrier 219 includes a vacuum system coupled to polisher head 218, and the membrane is configured to pick up and hold wafer 216 onto the membrane using vacuum suction. The polisher head 218 can further comprise a retainer ring mounted to the carrier 219 using mechanical fasteners (e.g., screws, or the like) or other suitable attachment means. During a representative chemical mechanical planarization process, the semiconductor wafer 216 is placed within the carrier 219 and is held by the retainer ring. In some embodiments, the retainer ring has an annular shape with a substantially hollow center. The semiconductor wafer 216 is placed in the center of the retainer ring such that the retainer ring holds the semiconductor wafer 216 in place. The semiconductor wafer 216 is positioned such that the layer to be planarized 305 faces in a direction (for example, downward) towards the polishing pad 225 in surface zone 212. The carrier 219 is configured to apply downward force or pressure urging the semiconductor wafer 216 into contact with the polishing pad 225 in surface zone 212. The polisher head 218 is configured to rotate the semiconductor wafer 216 over the polishing pad 225 during the chemical mechanical planarization process, thereby imparting mechanical abrading action to affect planarization or polishing of a contacting surface of the semiconductor wafer 216.

In some embodiments, the multi-zone platen 202 includes a slurry dispenser 214 configured to deposit a slurry 215 onto the polishing pad 225 in the surface zone 212. In an embodiment the slurry dispenser 214 is a single tube which extends through the first toroidal platen section 204 and dispenses the slurry 215 from a single point, allowing the motions of the first toroidal platen section 204, the second toroidal platen section 206, and the third toroidal platen section 208 to spread the slurry 215 during operation.

FIG. 4 additionally illustrates a pad conditioner 223 attached to a pad conditioner head 222. The pad conditioner head 222 is configured to rotate the pad conditioner 223 over the polishing pad 225 in surface zone 212. The pad conditioner 223 is mounted to the pad conditioner head 222 using mechanical fasteners (e.g., screws, or the like) or by other suitable attachment means. A pad conditioner arm is attached to the pad conditioner head 222, and is configured to move the pad conditioner head 222 and the pad conditioner 223 in a sweeping motion across a region of the polishing pad 225 in surface zone 212. In some embodiments, the pad conditioner head 222 is mounted to the pad conditioner arm using mechanical fasteners (e.g., screws, or the like) or by other suitable attachment means. The pad conditioner 223 comprises a substrate over which an array of abrasive particles is bonded in order to help remove built-up wafer debris and excess slurry 215 from the polishing pad 225 during the chemical mechanical planarization process. In some embodiments, the pad conditioner 223 also acts as an abrasive for the polishing pad 225 to create a desired texture (such as, e.g., grooves, or the like) against which the semiconductor wafer 216 may be polished.

An atomizer 220 may be included in order to provide a rinse over the polishing pad 225. In an embodiment the atomizer 220 may include a dispenser arm which comprises a number of nozzles on the bottom of the dispenser arm. During operation, the atomizer 220 may supply a high-pressure rinse in order to help clean the polishing pad 225.

As representatively illustrated in FIG. 4, a single polisher head (e.g., polisher head 218) and a polishing pad 225 comprising a plurality of polishing pad sections are utilized over the multi-zone platen 202; however, in other embodiments, multiple polisher heads may be utilized. In such embodiments, multiple workpieces (e.g., multiple ones of the semiconductor wafers 216) may be polished at a same time.

Figure 5:
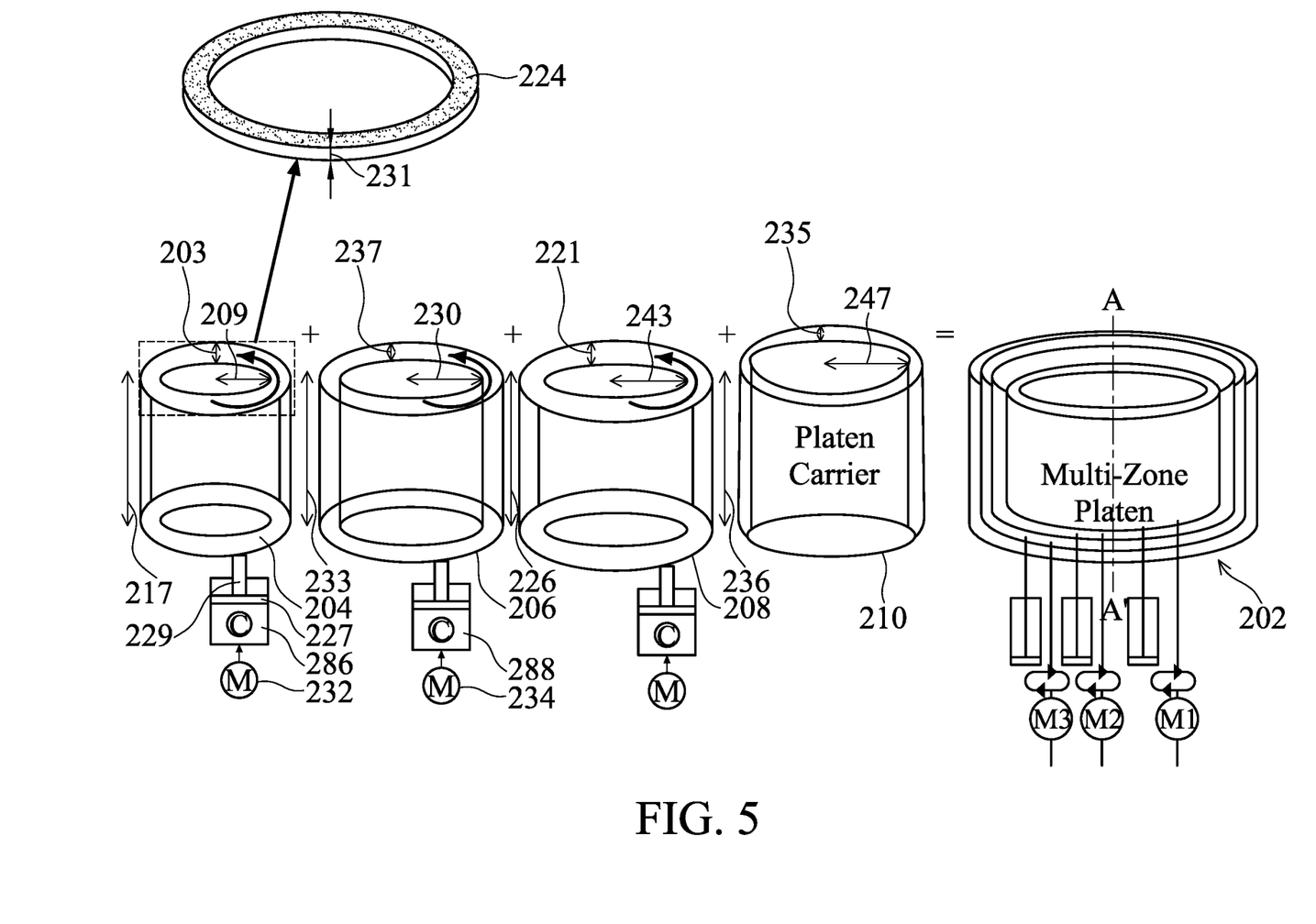
FIG. 5 representatively illustrates an exploded view of the multi-zone platen, in accordance with some embodiments.

FIG. 5 illustrates an exploded or expanded view of the multi-zone platen 202. In some embodiments, the multi-zone platen 202 includes the first toroidal platen section 204, the second toroidal platen section 206, the third toroidal platen section 208, and the platen carrier 210. Additionally, intermediate toroidal platen sections can be used along with the first toroidal platen section 204, the second toroidal platen section 206, and the third toroidal platen section 208.

Looking first at the first toroidal platen section 204, the first toroidal platen section 204 comprises a material such as stainless steel with a Teflon coating, although any suitable materials can be used. Additionally, the first toroidal platen section 204 may be shaped as a ring with a first thickness 203 of about 10 inches, with a range of about 1 inch to 50 inches, in an embodiment. Additionally, the first toroidal platen section 204 may also have a first radius 209 of about 40 inches, with a range of about 10 inches to 100 inches, such as between about 30 inches to 50 inches. Finally, the first toroidal platen section 204 may have a first height 217 of about 50 inches, with a range of about 30 inches to 100 inches. However, any suitable dimensions may be utilized.

Additionally, in another embodiment, the first toroidal platen section 204, being the innermost platen section, may also be shaped as a disc instead of a ring. In this embodiment the first toroidal platen section 204 may have an upper surface that extends across the entire first radius 209 (with openings for, e.g., the force component 104, the rotation component 106, the temperature component 110, etc.). As such the first toroidal platen section 204 may fill the entire area located within the second toroidal platen section 206.

Looking next at the second toroidal platen section 206, the second toroidal platen section 206 also comprises a material such as stainless steel with a Teflon coating, although any suitable materials can be used. Additionally, the second toroidal platen section 206 may be in a ring shape and is dimensioned so that the first toroidal platen section 204 can be nested within the second toroidal platen section 206. In some embodiments, the second toroidal platen section 206 can have a second thickness 237 of about 1 inch, with a range of about 0.5 inches to 10 inches. Additionally, the second toroidal platen section 206 can have a second radius 230 of about 50 inches, with a range of about 10 inches to 100 inches. Finally, the second toroidal section 206 may have a second height 233 of about 50 inches, with a range of about 30 inches to 100 inches. However, any suitable dimensions may be utilized.

Finally, in embodiments which utilize the third toroidal platen section 208, the third toroidal platen section 208 may also comprise a material such as stainless steel with a Teflon coating, although any suitable materials can be used. Additionally, the third toroidal platen section 208 may be in a ring shape and is dimensioned so that the second toroidal platen section 206 can be nested within the third toroidal platen section 208. In some embodiments, the third toroidal platen section 208 can have a third thickness 221 of about 1 inch, with a range of about 0.5 inches to 10 inches. Additionally, the third toroidal platen section 208 can have a third radius 243 of about 50 inches, with a range of about 10 inches to 100 inches. Finally, the third toroidal platen section 208 may have a third height 226 of about 50 inches, with a range of about 30 inches to 100 inches. However, any suitable dimensions may be utilized.

Additionally, while embodiments including multi-platen sections can have more than three platen sections, three toroidal platen sections are shown in FIG. 5. While the first toroidal platen section 204, the second toroidal platen section 206, and the third toroidal platen section 208 may have the thicknesses described above, the first toroidal platen section 204, the second toroidal platen section 206, and the third toroidal platen section 208 may also have thicknesses related to each other. In particular, each of the toroidal platen sections may collectively have a thickness difference which can vary within a first range from each other. In some embodiments the first range may vary from about 10% to about 300% from toroidal platen section to toroidal platen section (e.g., from the first toroidal platen section 204 to the second toroidal platen section 206). For example, in a particular embodiment in which the first toroidal section 204 has a thickness of 10 inches, the second toroidal platen section 206 may have a thickness of between about 1 inch and about 30 inches. However, any suitable range of variation may be utilized.

Additionally, while each of the separate toroidal platen sections (e.g., the first toroidal platen section 204, the second toroidal platen section 206, and the third toroidal platen section 208) can be made from the same material, this is intended to be illustrative and is not intended to be limiting. Rather, separate ones of the separate toroidal platen sections may be formed of different materials. Any suitable combination of materials for each of the separate toroidal platen sections may be utilized.

The first toroidal platen section 204, the second toroidal platen section 206, and the third toroidal platen section 208 are placed within the platen carrier 210. As such, the platen carrier 210 is sized to accommodate the first toroidal platen section 204, the second toroidal platen section 206, and the third toroidal platen section 208 (along with any other desired toroidal platen sections), and to provide at least lateral support and, in some embodiments, vertical support for the first toroidal platen section 204, the second toroidal platen section 206, and the third toroidal platen section 208 (along with any other desired toroidal platen sections). As such, the platen carrier 210 may have a fourth thickness 235 of between about 1 inches and about 10 inches, such as about 1 inch; may have a fourth radius 247 of between about 10 inches and about 100 inches, such as about 60 inches; and may have a fourth height 236 of between about 30 inches and about 100 inches, such as about 50 inch. However, any suitable dimensions may be utilized.

In an embodiment, the platen carrier 210 has a bottom that is shaped and sized to provide vertical support for the first toroidal platen section 204, the second toroidal platen section 206, and the third toroidal platen section 208, but still allow for the passage of other components, such as the force component 104, the rotation component 106, the slurry component 108, the temperature component 110, and the control component 112 (see FIG. 3). In some embodiments the bottom may be completely open, although in other embodiments the bottom may extend inward (from an outer radius) a portion or all of the way while still retaining openings for the components to extend through the platen carrier 210. Any suitable configuration may be utilized.

Additionally, additional ones of the toroidal platen sections may be included. Such additional intermediate toroidal platen sections will have a corresponding radius and thickness to be positioned between the third toroidal platen section 208 and the platen carrier 210. In some embodiments, the number of toroidal sections may range from between about 1 and about 100 sections. However, any suitable number of toroidal platen sections, with any suitable dimensions, may be utilized.

FIG. 5 additionally illustrates that each of the toroidal platen sections (e.g., the first toroidal platen section 204, the second toroidal platen section 206, and the third toroidal platen section 208) further has a separate mechanism for applying a separate force to each of the concentric toroidal platen sections and/or adjusting the relative height of each of the concentric toroidal platen sections (e.g., the first toroidal platen section 204, the second toroidal platen section 206, and the third toroidal platen section 208). In an embodiment, a first cylinder 286 and corresponding first serially-coupled motor 232 is used to provide the applied force to the first toroidal platen section 204, while a second cylinder 288 and corresponding second serially-coupled motor 234 is used to provide the applied force to the second toroidal platen section 206.

For example, the applied force generated from the first motor 232 can be applied to a bottom surface of the first toroidal platen section 204 through the first cylinder 286 and a mechanical linkage (e.g., the mechanical linkage 114). In an embodiment, the first cylinder 286 can comprise a pneumatic or hydraulic cylinder including a piston 227 having a first central shaft 229 that can be directly coupled to the first toroidal platen section 204 or indirectly coupled to the first toroidal platen section 204 through one or more mechanical linkages. The piston 227 is configured to move between a bottommost location to a topmost location, and a height range from the bottommost location to the topmost location may be between 0 mm and 5 mm, although any suitable distance can be utilized.

The piston 227 can be moved between the bottommost location and the topmost location using the controlled action of the first motor 232, for example, a brushless electrical stepper motor. In other embodiments the piston 227 can be moved between the bottommost location and the topmost location using a controlled flow of hydraulic fluids, air, or other suitable substance. Any suitable method of moving and controlling the piston 227 may be utilized.

By utilizing the first toroidal platen section 204, the second toroidal platen section 206, and the third toroidal platen section 208 along with their respective cylinders, a plurality of different zones of pressure can be created during the CMP process, and the process conditions of each different zone of pressure can be independently controlled. However, any suitable size may be utilized.

FIG. 5 additionally illustrates that each of the toroidal platen sections (e.g., the first toroidal platen section 204, the second toroidal platen section 206, and the third toroidal platen section 208), is attached to motors which can be used to control the rotation speed and rotation direction. In a particular embodiment a first motor M1 is used to control the rotation speed and rotation direction of the first toroidal platen section 204, while a second motor M2 is used to control the rotation speed and rotation direction of the second toroidal platen section 206 and a third motor M3 is used to control the rotation speed and rotation direction of the third toroidal platen section 208.

Additionally, while FIG. 5 illustrates an embodiment in which separate motors are connected to separate ones of the toroidal platen sections in a parallel arrangement, this is intended to be illustrative and is not intended to be limiting. For example, a series arrangement of motors, with separate gears leading to the separate toroidal sections and allowing for separate rotation speeds, may also be used. Any suitable combination of elements may be utilized to supply the separate control.

FIG. 5 also shows a placement of the polishing pad section 224 onto the first toroidal platen section 204 (while other polishing pad sections located on the second toroidal platen section 206 and the third toroidal platen section 208 are not illustrated for clarity). In an embodiment, the polishing pad section 224 is shaped to correspond to the underlying first toroidal platen section 204 and, as such, is also shaped as a toroidal section with similar lateral dimensions as the underlying first toroidal platen section 204. In an embodiment the polishing pad section 224 can have a fifth thickness 231 of about 2.5 mm and a range of thickness between 1.5 mm and 10 mm. However, any suitable dimensions may be utilized.

The polishing pad section 224 is affixed to the surface of the first toroidal platen section 204 in the previously described surface zone 212 shown in FIG. 4. Each of the other toroidal platen sections such as the second toroidal platen section 206 will also comprise a polishing pad section similar to the polishing pad section 224 to form the complete segmented polishing pad for the multi-zone platen 202. Each of the concentric polishing pads will have similar or the same lateral dimensions (thickness and radius) as the underlying toroidal platen section.

The polishing pad section 224 can be formed from materials such as one or more of polyvinyl alcohol, polyvinyl pyrrolidone, polyethylene, methylcellulose, hydropropylmethylcellulose, hydroxyethylcellulose, carboxymethylcellulose, maleic acid copolymer, oxide, and polyurethane. In some embodiments, the polishing pad section 224 may include a single layer or a composite layer of materials, such as felts, polymer impregnated felts, microporous polymer films, microporous synthetic leathers, filled polymer films, unfilled textured polymer films, combinations thereof, or the like. Representative polymers include polyurethane, polyolefins, or the like as previously described. Any suitable materials may be utilized.

Figure 6:
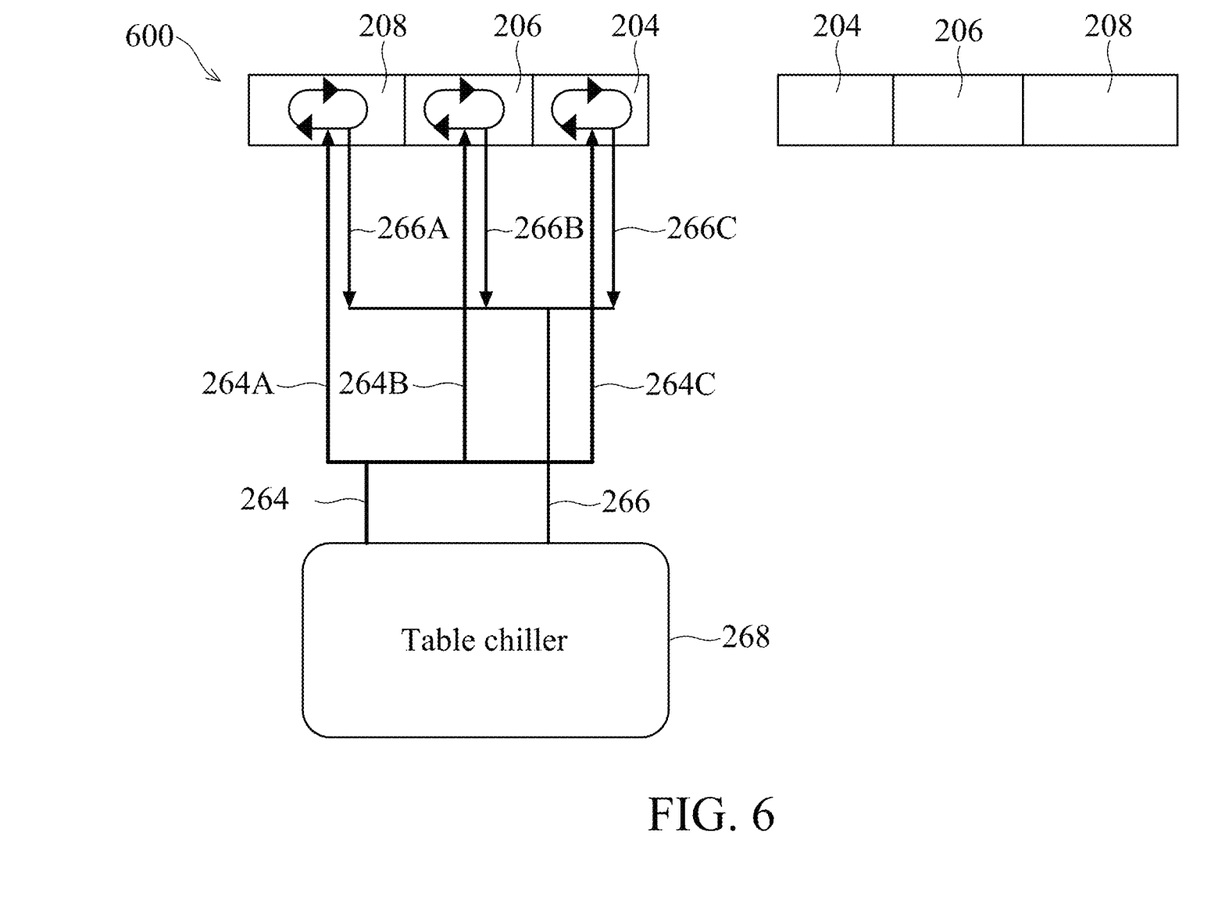
FIG. 6 representatively illustrates a temperature control system for the multi-zone platen, in accordance with some embodiments.

FIG. 6 illustrates a cross-sectional view through line A-A' in FIG. 5 of a temperature control regime 60o that may be used with the first toroidal platen section 204, the second toroidal platen section 206, and the third toroidal platen section 208. In an embodiment the multi-zone platen 202 includes a deionized water supply 264A and a deionized water return 266A for individually controlling the temperature of the third toroidal platen section 208; a deionized water supply 264B and a deionized water return 266B for individually controlling the temperature of the second toroidal platen section 206; and a deionized water supply 264C and an deionized water return 266C for individually controlling the temperature of the first toroidal platen section 204. The use of separate deionized water flows in the multi-zone platen 202 can individually control each zone temperature from about 10° C. to about 100° C. by, for example, individually controlling the temperature and/or flow rates of each of the deionized water supplies 264A, 264B, and 264C.

In an embodiment each of the deionized water supplies 264A, 264B, and 264C can be fed by a single deionized water supply 264 from a common source of deionized water such as table chiller 268. Alternatively, the table chiller 268 can directly supply the deionized water supplies 264A, 264B, and 264C. Each of the deionized water returns 266A, 266B, and 266C can be coupled together into a single deionized water return 266 that is returned to the table chiller 268.

In an embodiment, the deionized water supplies and returns can be a metal or plastic tube or pipe. The deionized water supplies and returns can be fed into the first toroidal platen section 204, the second toroidal platen section 206, and the third toroidal platen section 208 through, for example, a rotary union. In an embodiment, the rotary union provides a seal between a stationary supply passage (such as pipe or tubing for supplying and returning the deionized water) and a rotating part (such as the concentric first toroidal platen section 204, the second toroidal platen section 206, and the third toroidal platen section 208) to permit the flow of a fluid (such as the temperature controlled deionized water) into and/or out of the rotating part. In another embodiment, the heated or cooled deionized water supplies and returns can be fed into a stationary portion of the first toroidal platen section 204, the second toroidal platen section 206, and/or the third toroidal platen section 208, coupled to the rotating portions of the first toroidal platen section 204, the second toroidal platen section 206, and the third toroidal platen section 208 through, for example, ball bearings.

Returning now to FIG. 4, in order to planarize the layer to be planarized 305, the semiconductor wafer 216 is secured within the carrier 219 with the layer to be planarized 305 facing the first toroidal platen section 204, the second toroidal platen section 206, and the third toroidal platen section 208. Once in place, the carrier 219, the first toroidal platen section 204, the second toroidal platen section 206 and the third toroidal platen section 208 may be placed at the desired operating conditions for the planarization process.

For example, in an embodiment, a range of pressures (e.g., free pressures with no contact force on the wafer and/or press pressures) for the first pressure zone (e.g., over the first toroidal platen section 204) can be set at a range from 0 to 10K hPa, for example 100 hPa. Additionally, a range of pressures for the second pressure zone (e.g., over the second toroidal platen section 206) may be set differently from the range for the first toroidal platen section 204, such as by being set at a range from 0 to 10K hPa, for example, 100 hPa. Finally, a range of pressures for the third pressure zone (e.g., over the third toroidal platen section 208) may be set differently from the ranges for the first toroidal platen section 204 and the second toroidal platen section 206, such as by being set at a range from 0 to 10K hPa, for example, 100 Pa. However, any suitable pressures may be utilized.

In some embodiments the pressures for each of the first pressure zone, the second pressure zone and the third pressure zone may be set using, for example, their respective cylinders and motors (e.g. the pressure of the first pressure zone may be set by the first cylinder 286 and the motor 232). In a particular embodiment the cylinders may set the pistons at a desired height sufficient or pressure in order for the first pressure zone to apply (in conjunction with the pressure of the polisher head 218) the desired pressure to the layer to be planarized 305. However, any suitable methods of applying the pressure between the layer to be planarized 305 and the pressure zones may be utilized.

Additionally, with respect to the rotation speeds of the toroidal sections, the first toroidal platen section 204 may be set at a first rotation speed (either clockwise or counterclockwise) of between about 0 rpms and about 1000 rpms, such as about 100 rpm. Additionally, the second toroidal platen section 206 may be set at a second rotation speed (either clockwise or counterclockwise) different from the first rotation speed of between about 0 rpms and about 1000 rpms, such as about 100 rpm. Finally, the third toroidal platen section 208 may be set at a third rotation speed (either clockwise or counterclockwise) different from one or more of the first rotation speed and the second rotation speed, such as being between about 0 rpms and about 1000 rpms, such as about 100 rpm. Any suitable speeds may be utilized.

In an embodiment, the use of deionized water flow in the multi-zone platen 202 can individually control each zone temperature. In an embodiment a first temperature of the first toroidal platen section 204 may be set to be between about −196° C. and about 200° C., such as about 10° C. and about 100° C., such as about 46° C.; the second toroidal platen section 206 may be set at a second temperature different from the first temperature, such as being set between about −196° C. and about 200° C., such as between about 10° C. and about 100° C., such as about 46° C.; and the third toroidal platen section 208 may be set at a third temperature different from one or more of the first temperature and the second temperature, such as being set between about −196° C. and about 200° C., such as about 10° C. and about 100° C., such as about 46° C. However, any suitable temperature may be utilized.

Additionally, the slurry 215 may be introduced. Generally, a given composition of slurry 215 depends on the materials that are being utilized in the layer to be planarized 305. As such, while the precise composition of the slurry 215 is dependent at least in part on the materials of the layer to be planarized 305, in some embodiments slurry 215 may comprise a reactant, an abrasive, a surfactant, and a solvent.

The reactant may be a chemical, such as an oxidizer or a hydrolyzer, which chemically reacts with a material of the layer to be planarized 305 in order to assist the polishing pad section 224 in abrading or removing material. In some embodiments in which material to be removed includes, e.g., tungsten, the reactant may be, e.g., hydrogen peroxide, $Cr_2O7$, $MnO_4$, $OsO_4$; although other suitable reactants, such as hydroxylamine, periodic acid, other periodates, iodates, ammonium persulfate, peroxomonosulfates, peroxymonosulfuric acid, perborates, malonamide, combinations of same, or the like, that are configured to aid removal of material may be alternatively, conjunctively, or sequentially employed. In other embodiments, other reactants may be used to remove other types of materials. For example, in some embodiments in which a material to be removed includes, e.g., an oxide, the reactant may comprise, e.g., nitric acid ($HNO_3$), potassium hydroxide (KOH), ammonium hydroxide ($NH_4OH$), combinations of same, or the like.

The abrasive may include any suitable particulate that, in conjunction with the relative mechanical movement of the polishing pad section 224, is configured to polish or planarize the layer to be planarized 305. In some embodiments, a representative abrasive includes colloidal alumina. In other embodiments, an abrasive material may additionally include silica, aluminum oxide, cerium oxide, polycrystalline diamond, polymer particles (e.g., polymethacrylate, or the like), combinations of same, or the like.

The surfactant may be utilized to help disperse the reactant(s) and abrasive(s) within the slurry 215, and to prevent (or otherwise reduce the occurrence of) agglomeration of the abrasive during the chemical mechanical planarization process. In some embodiments, the surfactant may include polyethylene glycol (PEG), polyacrylic acid, sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, combinations thereof, or the like. However, such representative embodiments are not intended to be limited to the recited surfactants. Those skilled in the art will appreciate that any suitable surfactant may be alternatively, conjunctively, or sequentially employed.

A remaining portion of slurry 215 may include a solvent that may be utilized to combine the reactant(s), the abrasive (s), and the surfactant(s), and allow the mixture to be moved and dispersed onto the polishing pad section 224. In some embodiments, the solvent may include, e.g., deionized (DI) water, alcohol, or an azeotropic mixture thereof; however, other suitable solvent(s) may be alternatively, conjunctively, or sequentially employed.

In another embodiment chelating agents may also be added to the slurry 215. In an embodiment the chelating agent may be an agent such as ethylenediaminetetraacetic acid (EDTA), $C_6H_8O_7$, $C_2H_2O_4$, combinations of these or the like. However, any suitable chelating agent may be utilized.

In yet another embodiment the slurry 215 may also include pH adjusters in order to control the pH of the slurry 215. For example, in an embodiment a pH adjuster such as HCl, $HNO_3$, $H_3PO_4$, $C_2H_2(COOH)_2$, KOH, $NH_4OH$, combinations of these, or the like, may be added to the slurry 215 in order to adjust the pH of the slurry 215 up or down.

Additionally, other additives may also be added to help control and manage the CMP process. For example, downforce enhancers, polish rate inhibitors, or the like may also be added. Any suitable additives which may be useful to the polishing process may be utilized, and all such additives are fully intended to be included within the scope of the embodiments.

Once the slurry 215 is ready, the slurry 215 may be introduced to the multi-zone platen 202. In an embodiment the slurry 215 may be introduced at a flow rate of between about 100 cc/min and about 500 cc/min, such as about 250 cc/min. However, any suitable flow rate may be utilized.

During some embodiments, during the CMP process, the polisher head 218 will rotate at a speed of between about 50 rpm and about 150 rpm, such as about 110 rpm. Additionally, the polisher head 218 will press the wafer 216 and, thus, the layer to be planarized 305, against the polishing pad section 224. However, any suitable parameters can be utilized.

By utilizing the different parameters for the different toroidal platens (e.g., the first toroidal platen section 204, the second toroidal platen section 206, and the third toroidal platen section 208), the different zones of pressure will remove material from the layer to be planarized 305 at different speeds. For example, the first toroidal platen section 204 may remove material at a first rate of between about 100 Å/min and about 5000 Å/min, while the second toroidal platen section 206 may remove material at a different second rate, such as between about 100 Å/min and about 5000 Å/min. Finally, the third toroidal platen section 208 may remove material at a third rate (different from one or more of the first rate and the second rate) of between about 100 Å/min and about 5000 Å/min. However, any suitable rates of removal may be utilized.

The CMP process may be continued until the layer to planarized 305 has been planarized to the desired level of planarity. In one embodiment the CMP process may be continued for a period of time, such as between about 5 seconds and about 180 seconds, such as about 60 seconds. However, any suitable time may be utilized.

In other embodiments, the CMP process may be ended based upon an endpoint detection process. In some embodiments, a thickness profile of the layer to be planarized 305 may be measured in situ using an optical endpoint detection system (for either metal films, oxide films, or nitride films). In specific embodiments the endpoint detection system may use ellipsometry, interferometry, reflectometry, picosecond ultrasonics, atomic force microscopy (AFM), scanning tunneling microscopy (STM), scanning electron microscopy (SEM), transmission electron microscopy (TEM), or the like. In some embodiments, a thickness measurement apparatus (not illustrated) may be a part of the chemical mechanical planarization apparatus 100, and a thickness profile of the layer to be planarized 305 may be measured or otherwise determined during the CMP process until an appropriate endpoint has been reached.

Additionally, while the control component 112 may be used to set the polishing parameters at the beginning of the process and to hold the polishing parameters steady during the process, this is intended to be illustrative and is not intended to be limiting upon the embodiments. In another embodiment the control component 112 may be used to set an initial set of parameters for a first portion of the polishing process and also to change the polishing parameters during the polishing process. Any suitable number of modifications can be made to the polishing parameters, and all such modifications are fully intended to be included within the scope of the embodiments.

Once the layer to be planarized 305 has been planarized using the high-rate platen 207 (with, e.g., the multi-zone platen 202), the wafer 216 can be moved to the buffing platen 211. The buffing platen 211 will provide a fine polish to the layer to be planarized 305 and remove any defects that may have occurred during the relatively fast removal rate of the material from the layer to be planarized 305. Once finished, the wafer 216 may be removed from the CMP system 200 through the loadlocks 201, and additional processing may be performed.

It is an advantage that each zone of the multi-zone platen 202 can be individually controlled thus improving pad life and saving costs. It is a further advantage that corrosion and scratch performance can be improved by use of the multi-zone platen 202 to better control and fine tune the polishing parameters. It is a further advantage that the with-in wafer (WiW) thickness range can be improved by using the multi-zone platen 202 to better control polishing parameters of the chemical mechanical polishing apparatus. For example, by utilizing the multi-zone platen 202 as described herein, the WiW thickness range may be lowered to between about 5 Å and about 20 Å, such as about 10 Å.

Figure 7:
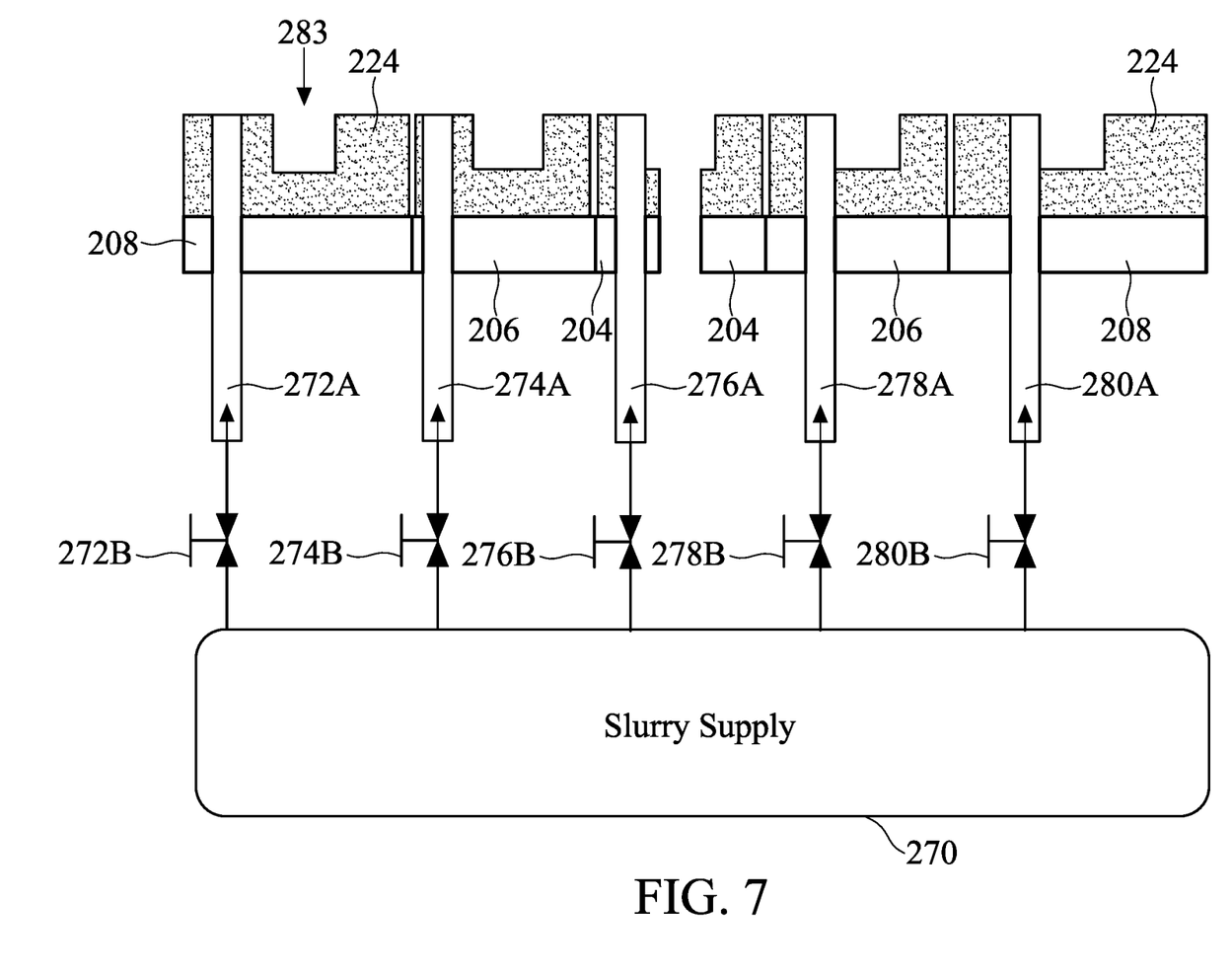
FIG. 7 representatively illustrates a multiple slurry system, in accordance with some embodiments.

FIG. 7 illustrates another embodiment in which the slurry 215, instead of being dispensed through a single dispensing pipe is, instead, dispensed through multiple dispensers, such as slurry supply lines 272A, 274A, 276A, 278A, and 280A. In an embodiment the one or more slurry supply lines 272A, 274A, 276A, 278A, and 280A can supply slurry to the surface of the polishing pad section 224 over a corresponding toroidal platen section. For example, the supply lines 272A and 280A can supply the slurry 215 through the third toroidal platen section 208, the supply lines 274A and 278A can supply the slurry 215 through the second toroidal platen section 206, and the supply line 276A can supply the slurry 215 through the first toroidal platen section 204. However, any suitable number of slurry supply lines can be used.

Additionally, each of the slurry supply lines 272A, 274A, 276A, 278A, and 280A can be individually controlled through valves 272B, 274B, 276B, 278B, and 280B. In an embodiment, the flow rate of the individual slurry supplies is controlled separately from each other. All of the slurry supply lines 272A, 274A, 276A, 278A, and 280A are fed by a single common slurry supply 270. In other embodiments, individual slurry supplies, or even individual, separate slurries, can be used. In an embodiment, the slurry supply lines 272A, 274A, 276A, 278A, and 280A can be a plastic or metal pipe or tube.

As illustrated, in some embodiments the slurry supply lines 272A, 274A, 276A, 278A, and 280A can extend through each of their respective toroidal platen sections (e.g., through the first toroidal platen section 204, the second toroidal platen section 206, and the third toroidal platen section 208). In other embodiments the slurry supply lines 272A, 274A, 276A, 278A, and 280A can extend between gaps located between the toroidal platen sections (e.g., between the first toroidal platen section 204 and the second toroidal platen section 206 or else between the second toroidal platen section 206 and the third toroidal platen section 208).

FIG. 7 additionally illustrates that, in some embodiments, the polishing pad section 224 can also comprise a surface groove pattern 283. In an embodiment the surface groove pattern 283 can include a pattern of one or more concentric circles, eccentric circles, radioactivity grooving such as a logarithmic spiral, a circle combined X-type groove pattern, a matrix arrangement, a circle combined matrix arrangement, a non-grooving pattern, combinations of these, or the like. However, any suitable pattern can be used.

Figure 8:
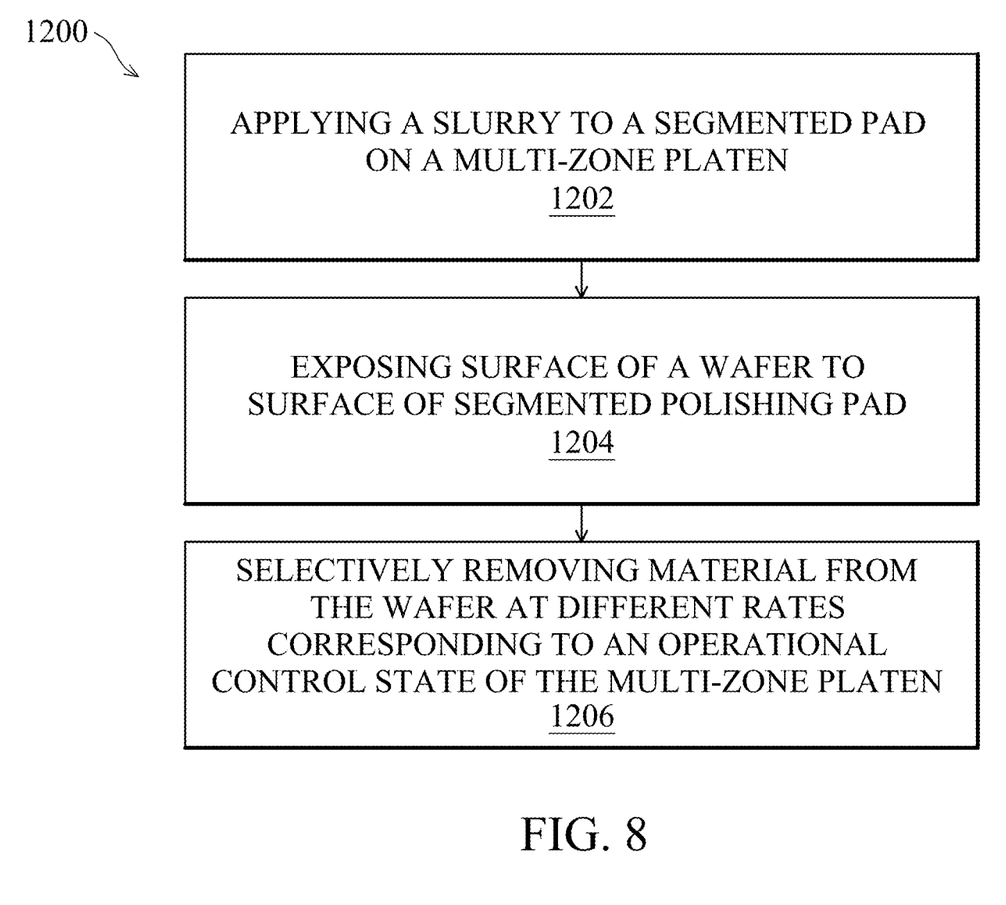
FIG. 8 illustrates a flowchart of a representative method in accordance with some embodiments.

FIG. 8 illustrates method steps of a method 1200 of operating the chemical mechanical polishing apparatus is shown in FIG. 4. At step 1202 the slurry 215 is applied to the surface of the segmented polishing pad section 224 on the multi-zone platen 202 including a plurality of individually controlled concentric toroidal platen sections (e.g., the first toroidal platen section 204, the second toroidal platen section 206, and the third toroidal platen section 208). At step 1204, the bottom surface of the wafer 216 is exposed to the surface of the segmented polishing pad section 224. At step 1206, material from the layer to be planarized 305 is removed at different rates corresponding to an operational control state of the multi-zone platen 202. The operational control state is provided by a control component 112 or microprocessor for generating a plurality of control signals to individual components for controlling the pressure applied to each of the zones, the relative height of each zone, the rotational speed and rotational direction of each zone, the temperature of each zone, and the slurry flow rate at the surface of each zone. Additional processing steps can be added to method 1200, in embodiments.

According to an embodiment, a chemical mechanical planarization apparatus includes: a first toroidal platen section configured to hold a first polishing pad to remove material from a wafer; and a second toroidal platen section configured to hold a second polishing pad to remove material from the wafer, wherein the first toroidal platen section is nested within the second toroidal platen section and wherein the first toroidal platen section is independently movable from the second toroidal platen section. In an embodiment, the apparatus further includes a platen carrier, wherein the second toroidal platen section is nested within the platen carrier. In an embodiment, the apparatus further includes: a first mechanical linkage attached to the first toroidal platen section; and a second mechanical linkage attached to second toroidal platen section, the first mechanical linkage being different from the second mechanical linkage. In an embodiment, the apparatus further includes: a first motor attached to the first toroidal platen section; and a second motor attached to the second toroidal platen section, the first motor being different from the second motor. In an embodiment, the apparatus further includes: a first temperature liquid line connected to the first toroidal platen section; and a second temperature liquid line connected to the second toroidal platen section, the first temperature liquid line being different from the second temperature liquid line. In an embodiment, a rotation speed of the first toroidal platen section is individually controlled from the second toroidal platen section. In an embodiment, at least one of the first polishing pad or the second polishing pad comprises a circular groove pattern.

According to another embodiment, a chemical mechanical planarization apparatus includes: a platen comprising a plurality of concentric toroids, wherein at least one of a rotation direction, rotation speed, force, relative height, or temperature of each concentric toroid is individually controlled; a plurality of concentric polishing pad sections, wherein each one of the plurality of concentric polishing pad sections is affixed to a respective one of the plurality of concentric toroids; and at least one slurry supply. In an embodiment the plurality of concentric toroids comprises at least three concentric toroids. In an embodiment at least one of the plurality of concentric polishing pad sections has a groove pattern within a surface of the at least one of the plurality of concentric polishing pad sections. In an embodiment the at least one slurry supply is connected to multiple dispensing tubes. In an embodiment the apparatus further includes: a first slurry supply coupled to a first one of the plurality of concentric toroids; and a second slurry supply coupled to a second one of the plurality of concentric toroids, the first slurry supply being different from the second slurry supply. In an embodiment the apparatus further includes: a first motor coupled to a first one of the plurality of concentric toroids; and a second motor coupled to a second one of the plurality of concentric toroids, the first motor being different from the second motor. In an embodiment the apparatus further includes: a first cooling line coupled to a first one of the plurality of concentric toroids; and a second cooling line coupled to a second one of the plurality of concentric toroids, the first cooling line being different from the second cooling line.

In another embodiment, a method for polishing a surface of a wafer includes: configuring a first toroidal platen section to rotate at a first speed; configuring a second toroidal platen section to rotate at a second speed different from the first speed, the first toroidal platen section being nested within the second toroidal platen section; and planarizing a layer with at least one of the first toroidal platen section rotating at the first speed or the second toroidal platen section rotating at the second speed. In an embodiment the first speed is between 0 rpms and 1000 rpms and the second speed is between 0 rpms and 1000 rpms. In an embodiment the method further includes configuring the first toroidal platen section to apply a first pressure of between about 0 and 10K Pa and configuring the second toroidal platen section to apply a second pressure different from the first pressure. In an embodiment the first toroidal platen section is held at a first temperature of between 10° C. to 100° C., and wherein the second toroidal platen section is held at a second temperature different from the first temperature. In an embodiment the method further includes dispensing a slurry from a single location onto a first polishing pad over the first toroidal platen section. In an embodiment the method further includes dispensing a slurry from multiple locations onto a first polishing pad over the first toroidal platen section and onto a second polishing pad over the second toroidal platen section.

The foregoing outlines features of several embodiments so that those skilled in the art may better understand aspects of the present disclosure. Skilled artisans will appreciate that they may readily use the present disclosure as a basis for designing or modifying other processes or structures for carrying out same or similar purposes, or for achieving same or similar advantages of embodiments discussed herein. Those skilled in the art will also realize that such equivalent constructions do not depart from the spirit and scope of the present disclosure, and that various changes, substitutions, or alterations may be made without departing from the spirit and scope of the present disclosure.

What is claimed is:

1. A chemical mechanical planarization apparatus comprising:
   a first toroidal platen section configured to hold a first polishing pad to remove material from a wafer;
   a second toroidal platen section configured to hold a second polishing pad to remove material from the wafer, wherein the first toroidal platen section is nested within the second toroidal platen section and wherein the first toroidal platen section is independently movable from the second toroidal platen section; and
   a platen carrier, wherein the second toroidal platen section is nested within the platen carrier, wherein the platen carrier has a height greater than a height of the second toroidal platen.

2. The chemical mechanical planarization apparatus of claim 1, further comprising:
   a first mechanical linkage attached to the first toroidal platen section; and
   a second mechanical linkage attached to second toroidal platen section, the first mechanical linkage being different from the second mechanical linkage.

3. The chemical mechanical planarization apparatus of claim 1, further comprising:
   a first motor attached to the first toroidal platen section; and
   a second motor attached to the second toroidal platen section, the first motor being different from the second motor.

4. The chemical mechanical planarization apparatus of claim 1, further comprising:
   a first temperature liquid line connected to the first toroidal platen section; and
   a second temperature liquid line connected to the second toroidal platen section, the first temperature liquid line being different from the second temperature liquid line.

5. The chemical mechanical planarization apparatus of claim 1, wherein a rotation speed of the first toroidal platen section is individually controlled from the second toroidal platen section.

6. The chemical mechanical planarization apparatus of claim 1, wherein at least one of the first polishing pad or the second polishing pad comprises a circular groove pattern.

7. The chemical mechanical planarization apparatus of claim 1, wherein the first toroidal platen section and the second toroidal platen section have different thicknesses.

8. A chemical mechanical planarization apparatus comprising:
   a platen comprising a plurality of concentric toroids, wherein at least one of a rotation direction, rotation speed, force, relative height, or temperature of each concentric toroid is individually controlled;
   a platen carrier, wherein the concentric toroids are nested within the platen carrier and not vertically extending from the platen carrier;
   a plurality of concentric polishing pad sections, wherein each one of the plurality of concentric polishing pad sections is affixed to a respective one of the plurality of concentric toroids;
   at least one slurry supply.

9. The chemical mechanical planarization apparatus of claim 8, wherein the plurality of concentric toroids comprises at least three concentric toroids.

10. The chemical mechanical planarization apparatus of claim 8, wherein at least one of the plurality of concentric polishing pad sections has a groove pattern within a surface of the at least one of the plurality of concentric polishing pad sections.

11. The chemical mechanical planarization apparatus of claim 8, wherein the at least one slurry supply is connected to multiple dispensing tubes.

12. The chemical mechanical planarization apparatus of claim 8, further comprising:
   a first slurry supply coupled to a first one of the plurality of concentric toroids; and
   a second slurry supply coupled to a second one of the plurality of concentric toroids, the first slurry supply being different from the second slurry supply.

13. The chemical mechanical planarization apparatus of claim 8, further comprising:
   a first motor coupled to a first one of the plurality of concentric toroids; and
   a second motor coupled to a second one of the plurality of concentric toroids, the first motor being different from the second motor.

14. The chemical mechanical planarization apparatus of claim 8, further comprising:
   a first cooling line coupled to a first one of the plurality of concentric toroids; and
   a second cooling line coupled to a second one of the plurality of concentric toroids, the first cooling line being different from the second cooling line.

15. A method for polishing a surface of a wafer comprising:
   configuring a first toroidal platen section to rotate at a first speed;
   configuring a second toroidal platen section to rotate at a second speed different from the first speed, the first toroidal platen section being nested within the second toroidal platen section, wherein the second toroidal platen section is nested within a platen carrier; and
   placing a layer within the platen carrier and planarizing the layer with at least one of the first toroidal platen section rotating at the first speed or the second toroidal platen section rotating at the second speed.

16. The method of claim 15, wherein the first speed is between 0 rpms and woo rpms and the second speed is between 0 rpms and moo rpms.

17. The method of claim 15, further comprising configuring the first toroidal platen section to apply a first pressure of between about 0 and 10K hPa when configuring the first toroidal platen section to rotate at the first speed and configuring the second toroidal platen section to apply a second pressure different from the first pressure when configuring the second toroidal platen section to rotate at the second speed.

18. The method of claim 15, wherein the first toroidal platen section is held at a first temperature of between 10° C. to 100° C. when configuring the first toroidal platen section to rotate at the first speed, and wherein the second toroidal platen section is held at a second temperature different from the first temperature when configuring the second toroidal platen section to rotate at the second speed.

19. The method of claim 15, further comprising dispensing a slurry from a single location onto a first polishing pad over the first toroidal platen section.

20. The method of claim 15, further comprising dispensing a slurry from multiple locations onto a first polishing pad over the first toroidal platen section and onto a second polishing pad over the second toroidal platen section.

* * * * *

UNITED STATES PATENT AND TRADEMARK OFFICE
CERTIFICATE OF CORRECTION

PATENT NO. : 11,772,228 B2
APPLICATION NO. : 16/746292
DATED : October 3, 2023
INVENTOR(S) : Ting-Hsun Chang et al.

It is certified that error appears in the above-identified patent and that said Letters Patent is hereby corrected as shown below:

In the Claims

Claim 16, Column 18, Line 23; delete "woo" and insert --1000--.

Claim 16, Column 18, Line 24; delete "moo" and insert --1000--.

Signed and Sealed this
Fifth Day of December, 2023

Katherine Kelly Vidal
*Director of the United States Patent and Trademark Office*